United States Patent
Park

(10) Patent No.: US 6,835,951 B2
(45) Date of Patent: Dec. 28, 2004

(54) ACTIVE MATRIX ORGANIC LIGHT EMITTING DEVICE AND METHOD FOR FABRICATING THE SAME

(75) Inventor: Jae-Yong Park, Gyeonggi-Do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 61 days.

(21) Appl. No.: 10/287,538

(22) Filed: Nov. 5, 2002

(65) Prior Publication Data

US 2003/0085405 A1 May 8, 2003

(30) Foreign Application Priority Data

Nov. 7, 2001 (KR) .......................... 2001-69197

(51) Int. Cl.[7] .......................... H01L 51/20; H01L 51/40
(52) U.S. Cl. .............................. 257/40; 257/72; 438/99; 438/151
(58) Field of Search ....................... 257/40, 72; 438/99, 438/151

(56) References Cited

U.S. PATENT DOCUMENTS 6,384,427 B1 * 5/2002 Yamazaki et al. ............ 257/59
6,476,419 B1 * 11/2002 Yasuda ......................... 257/72
2001/0017372 A1 * 8/2001 Koyama ....................... 257/72
2002/0171611 A1 * 11/2002 Cok ............................. 345/82

FOREIGN PATENT DOCUMENTS

JP 11-195492 7/1999

* cited by examiner

*Primary Examiner*—Hoai Pham
*Assistant Examiner*—Stephen W. Smoot
(74) *Attorney, Agent, or Firm*—Morgan, Lewis & Bockius LLP

(57) ABSTRACT

An active matrix organic light emitting device includes a plurality of gate lines and data lines respectively arranged along transverse and longitudinal directions for defining a plurality of pixel regions, a plurality of power lines arranged substantially parallel to the data lines, at least one switching thin film transistor disposed within one of the pixel regions, at least one driving thin film transistor disposed within the one of the pixel regions, an organic light emitting unit formed within the one of the pixel regions to emit light by application of a signal through one of the power lines as the driving thin film transistor is enabled, and a plurality of power supplying lines having at least two layers electrically interconnected to each other, the power supplying lines electrically connected with the plurality of the power lines to supply the signal to each of the power lines.

33 Claims, 4 Drawing Sheets

ACTIVE MATRIX ORGANIC LIGHT EMITTING DEVICE AND METHOD FOR FABRICATING THE SAME

The present invention claims the benefit of Korean Patent Application No. 69197/2001 filed in Korea on Nov. 7, 2001, which is hereby incorporated by reference.

BACKGROUND OF THE INVENTION

1. Field of the Invention

The present invention relates to an active matrix type organic light emitting device, and particularly, to an active matrix organic light emitting device and a method for fabricating the same that supplies an electric source to a power supply line for redundancy even if an opening is generated on the power supplying line.

2. Description of the Related Art

Currently, research for electrically conductive organic materials, such as conjugate polymers poly(p-phenylinevinyline) (PPV), for application to light emitting devices is ongoing. In addition, research is being conducted for application of the electrically conductive organic materials to thin film transistors (TFT), sensors, lasers, and photo-electric devices. Presently, light emitting devices made of inorganic phosphor materials are disadvantageous because an operating voltage of the devices should be higher than 200VAC. Accordingly, it is difficult to enlarge an overall size of the devices since they are fabricated using an evaporation process. Thus, achieving a blue light emission is difficult, and the cost for fabricating the devices is high. However, light emitting devices made of organic materials are advantageous because of their superior light emitting efficiency, simplicity in enlarging their overall size, simplified fabricating procedures, and improved blue light emission. In addition, light emitting devices made of organic materials have the ability to be curved. Thus, the light emitting devices made of organic materials are promoted as being the next generation of display devices.

FIG. 1 is a plan view of an active matrix organic light emitting device according to the related art. In FIG. 1, the active matrix organic light emitting device 10 includes a switching TFT 17 and a driving TFT 18. In the active matrix organic light emitting device 10, an N×M number of pixels are defined by a plurality of gate lines 11 and a plurality of data lines 13 arranged in a matrix form. Within each of the pixels, the switching TFT 17 is switched as a scanning signal is applied from the gate line 11 and a data signal of the data line 13 is inputted therein, the driving TFT 18 is enabled as the switching TFT 17 is turned ON, and an organic light emitting unit 19 for emitting light is turned ON. In addition, a power line 15 is arranged to be parallel with the data line 13 for applying an excitation signal to the organic light emitting unit 19 when the driving TFT 18 is enabled. A storage capacitor 20 is included to maintain the excited state of the organic light emitting unit 19.

An outer driving circuit (not shown) is disposed along an outer side of the organic light emitting device 10, and is electrically connected to the organic light emitting device 10 through bonding pads 21 and 22 formed on end parts of the gate line 11 and data line 13. The power line 15 is also connected to the outer driving device (i.e., power supplying device). The gate lines 11 and the data lines 13 are directly connected to the outer driving circuit. However, the power line 15 is connected to the outer driving circuit through a power supplying line 23. The power supplying line 23 is formed on a same layer upon which source/drain electrodes of the driving TFT 18 are formed, and is formed of the same metal as the source/drain electrodes. In addition, all of the power lines 15 are electrically connected to the power supply line 23, thereby providing all of the power lines 15 with the exciting signal. When the driving TFT 18 is turned ON by application of a signal transmitted by the switching TFT 17, electric power applied to the power supplying line 23 is applied to the organic light emitting unit 19 through the power line 15, thereby emitting light from the organic light emitting unit 19. Accordingly, an image data is displayed on a screen of the organic light emitting device 10.

In FIG. 1, the power supplying line 23 is formed to extend from the first pixel to the last pixel along a transverse direction, or longitudinal direction of the panel 10. Accordingly, the power supplying line 23 provides respective pixels with the exciting signal. The power supplying line 23 is formed by depositing and etching the same metal material as that of the source/drain electrodes of the driving TFT 18 when the source/drain electrodes are formed. Therefore, the power supplying line 23 may be damaged by inner processing conditions or by outer processing conditions during deposition and/or etching, or by exterior mechanical shock. As a result, an opening is generated in the power supplying line 23, whereby the exciting signal is not transmitted to an adjacent pixel beyond the opening even if the driving TFT 18 is turned ON. Accordingly, the image data is not formed on the adjacent pixel of the organic light emitting device 10, thereby rendering the organic light emitting device 10 operationally inferior.

In FIG. 1, the power supplying line 23 of the organic light emitting device 10 may be divided along a length direction, thereby creating plural power supplying lines. Accordingly, a total number of the power lines 15 connected to the power supplying line 23 is decreased. In addition, the effects of an opening in the power supplying line 23 is reduced. However, when the opening is generated in one power supplying line 23, an entire row of pixels does not operate, thereby forming a strip shape on the screen. Moreover, when the opening is generated between the power supplying line 23 and the data line 13, an entire column of pixels does not operate.

SUMMARY OF THE INVENTION

Therefore, an object of the present invention is to provide an active matrix organic light emitting device and a method of fabricating the same that substantially obviates one or more of the problems due to limitations and disadvantages of the related art.

An object of the present invention is to provide an active matrix organic light emitting device having a power supplying line for redundancy on a power supplying line to a supply power to a thin film transistor (TFT) for driving the organic light emitting layer.

Another object of the present invention is to provide a method for fabricating an active matrix organic light emitting device having a power supplying line for redundancy on a power supplying line to a supply power to a thin film transistor (TFT) for driving the organic light emitting layer.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an active matrix organic light emitting device includes a plurality of gate lines and data lines respectively arranged along transverse and longitudinal directions for defining a plurality of pixel regions, a plurality of power lines arranged substantially parallel to the data lines, at least one switching thin film transistor disposed within one of the pixel regions, at least one driving thin film transistor disposed within the one of the pixel regions, an organic light emitting unit formed within the one of the pixel regions to emit light by application of a signal through one of the power lines as the driving thin film transistor is enabled, and a plurality of power supplying lines having at least two layers electrically interconnected to each other, the power supplying lines electrically connected with the plurality of the power lines to supply the signal to each of the power lines.

In another aspect, an active matrix organic light emitting device includes an array including a plurality of pixel regions defined by a plurality of gate lines and date lines, the array including a plurality of power lines arranged along a direction parallel to the data lines, a driving member disposed within one of the pixel regions, and an organic emitting unit disposed in the one of the pixel regions for emitting light by application of a signal transmitted by one of the power lines according to actuation of the driving member, a power supplying line disposed along a side of the array for applying the signal to the plurality of power lines, and a redundancy power supplying line disposed along the side of the array, wherein the redundancy power supplying line is electrically interconnected to the power supplying line.

In another aspect, an active matrix organic light emitting device includes a substrate having a pixel region and a power driving region, a semiconductor layer on the pixel region, a gate insulating layer disposed along an entire surface of the substrate, a gate electrode and a first power supplying line formed within the pixel region on the gate insulating layer, a first power supplying line formed within the power supplying line region on the gate insulating layer, an intermediate layer disposed over the gate insulating layer, source/drain electrodes disposed within the pixel region on the intermediate layer, a second power supplying line formed within the power supplying line region on the intermediate layer and connected to the first power supplying line, a passivation layer disposed over the pixel region, and an organic light emitting unit within the pixel region on the passivation layer for emitting light by application of a signal through the second power supplying line.

In another aspect, a method for fabricating an active matrix organic light emitting device includes forming a semiconductor layer within a pixel region of a substrate, forming a gate insulating layer over an entire surface of the substrate, forming respectively a gate electrode within the pixel region of the substrate on the gate insulating layer, forming a first power supplying line within a power supplying line region on the gate insulating layer, forming an intermediate layer over the gate insulating layer, forming respectively a source/drain electrode connected to the semiconductor layer within the pixel region, forming a second power supplying line connected to the first power supplying line within the power supplying region on the intermediate layer, forming a passivation layer over the pixel region, and forming an organic light emitting unit on the passivation layer.

In another aspect, a method for fabricating an active matrix organic light emitting device includes forming a semiconductor layer within a pixel region of a substrate, forming a gate insulating layer over an entire surface of the substrate, forming a gate electrode within the pixel region on the gate insulating layer, forming a redundant power supplying line within a power supplying line region on the gate insulating layer, forming an intermediate layer over the gate insulating layer, forming respectively a source/drain electrode electrically connected to the semiconductor layer within the pixel region through the gate insulating layer and intermediate layer, forming a power supplying line within the power supplying region on the intermediate layer, forming a passivation layer over the pixel region, forming an organic light emitting unit on the passivation layer, and electrically interconnecting the power supplying line with the redundant power supplying line by processing side portions of an open circuit portion of the power supplying line with light from a light source when the power supplying line is electrically opened.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
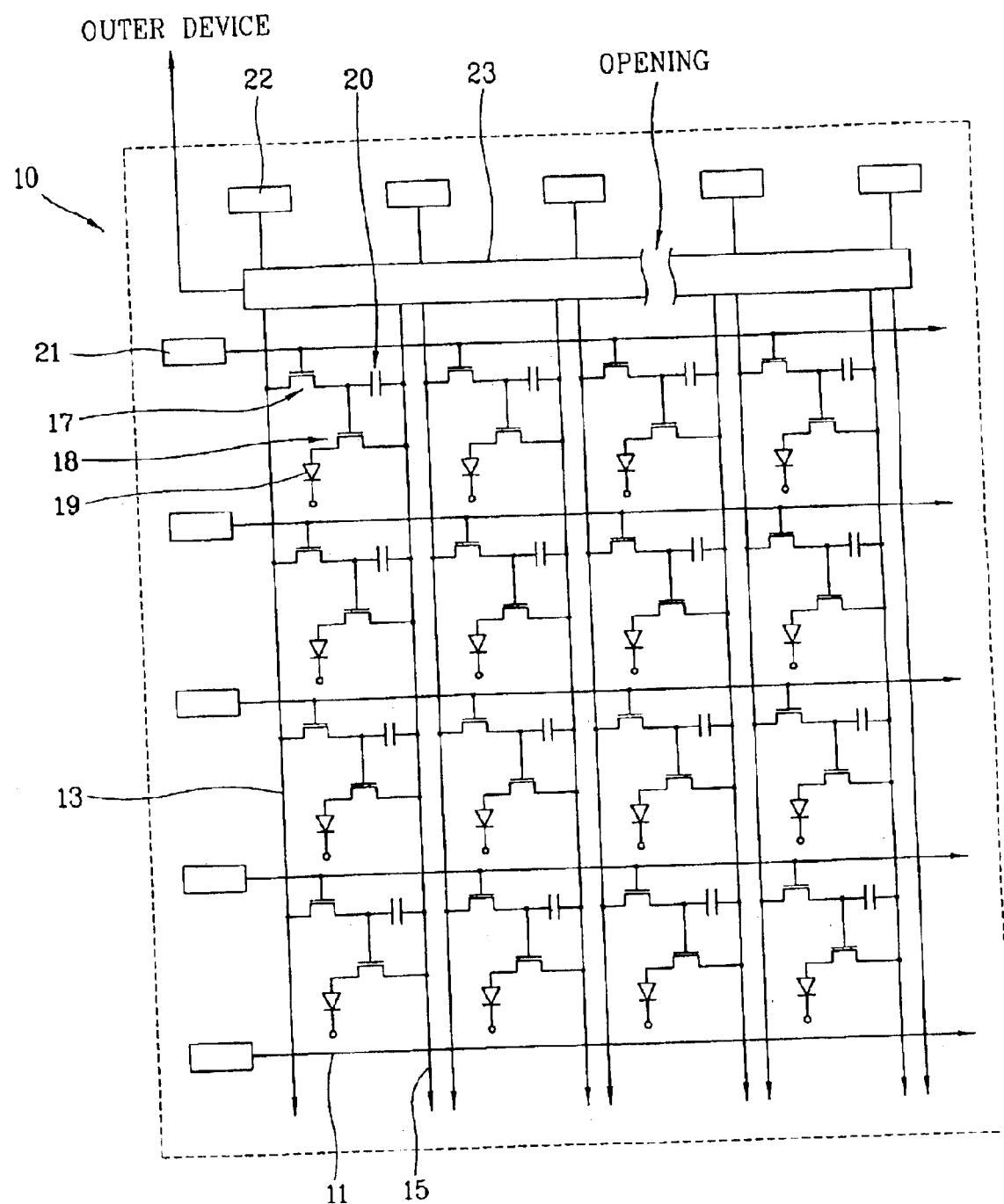
FIG. 1 is a plan view of an active matrix organic light emitting device according to the related art.
Figure 2:
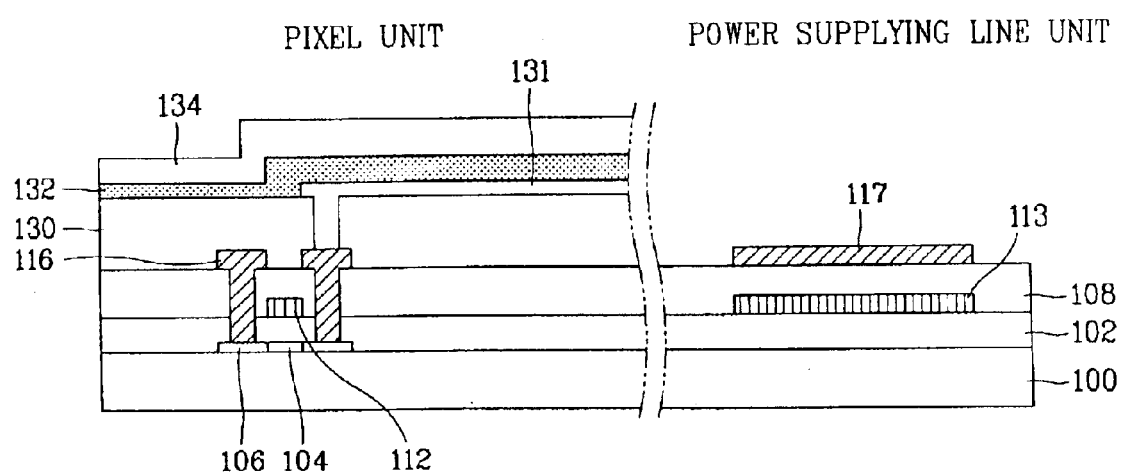
FIG. 2 is a partial cross sectional view of an exemplary active matrix organic light emitting device according to the present invention.

FIG. 2 is a partial cross sectional view of an exemplary active matrix organic light emitting device according to the present invention. FIG. 2, a substrate 100, which may include a transparent insulating material such as glass, may include a semiconductor layer 104 and impurity semiconductor layers 106 formed on both sides of the semiconductor layer 104. A gate insulating layer 102 may be formed on entire surface of the substrate 100, and may include an inorganic material, such as SiNx or SiOx. The gate insulating layer 102 may cover the semiconductor layer 104 and the impurity semiconductor layers 106. The semiconductor layer 104 and the impurity semiconductor layers 106 may include polycrystalline and amorphous semiconductor materials, wherein the amorphous semiconductor material may formed using an annealing step to form the semiconductor layer 104.

A gate electrode 112 and a first power supplying line 113 may be formed on the gate insulating layer 102 within a pixel unit and on a power supplying line unit on the gate insulating layer 102, respectively. The gate electrode 112 may be formed during a photolithographic process, and may include a metal material, such as Al, Al alloy, Cu, or Mo. The gate electrode 112 may include a single layer or may include a plurality of different metallic layers. The first power supplying line 113 may function as a redundant power supplying line when a corresponding primary power supplying line is electrically opened. The first power supplying line may be formed using different metal materials from the material or materials of the gate electrode 112. However, the first power supplying line 113 may be simultaneously formed when the gate electrode 112 is formed, and may be formed of a same metal as the material or materials of the gale electrode 112.

An intermediate layer 108 made of inorganic material, such as SiOx, may be formed on the gate insulating layer 102 upon which the gate electrode 112 and the first power supplying line 113 are formed. Source/drain electrodes 116 and a second power supplying line 117 may be formed in the pixel unit and on the power supplying line unit, respectively. In FIG. 2, a contact hole may be formed in the gate insulating layer 102 and in the intermediate layer 108 to electrically connect the source/drain electrodes 116 to the impurity semiconductor layers 106.

The source/drain electrodes 116 may include a single material layer, such as Al, an Al alloy, Cr, Mo, or Cu, or as a plurality of different material layers, and may be formed by photolithographic process. The second power supplying line 117 may include metal materials different from the material or materials of the source/drain electrodes 116. However, the second power supplying line 117 may include material or materials similar to the metal materials to form the source/drain electrodes 116.

The first power supplying line 113 and the second power supplying line 117 may be formed to have similar widths, or may be formed to have different widths. In a case where the widths of the first and second supplying lines 113 and 117 are formed to be different from each other, the first and second power supplying lines 113 and 117 may be aligned with each other. In addition, lengths of the first and second power supplying lines 113 and 117 may be formed to be different from each other. However, the first and second power supplying lines 113 and 117 may extend from a first pixel to a last pixel along a transverse direction (or longitudinal direction) of the organic light emitting device.

A passivation layer 130 may be formed on the intermediate layer 108 by depositing an inorganic material, such as SiNx. Alternatively, an organic material may be used to form the passivation layer 130, such as benzocyclobutane (BCB). In addition, a lamination of inorganic and organic materials may be used to form the passivation layer 130.

An transparent anode 131 may be formed on the passivation layer 130 of the pixel unit, and may be electrically connected to the source/drain electrodes 116 through the contact hole formed on the passivation layer 130. The anode 131 may include a lamination of a transparent metal material having high work function, such as indium tin oxide (ITO), by deposition and/or sputtering processes. A light emitting layer 132 may be formed on the anode 131 to include organic materials, and a cathode 134 having low work function may be formed on the light emitting layer 132.

When an exciting signal is supplied to the anode 131 and to the cathode 134 through the source/drain electrodes 116, holes and electrons are injected into the light emitting layer 132 from the anode 131 and the cathode 134, respectively. Accordingly, an exciton is generated within the light emitting layer 132. As the exciton decays, Light corresponding to a difference between the lowest unoccupied molecular orbital (LUMO) and the highest occupied molecular orbital (HOMO) is generated and emitted from the light emitting layer 132.

Figure 3:
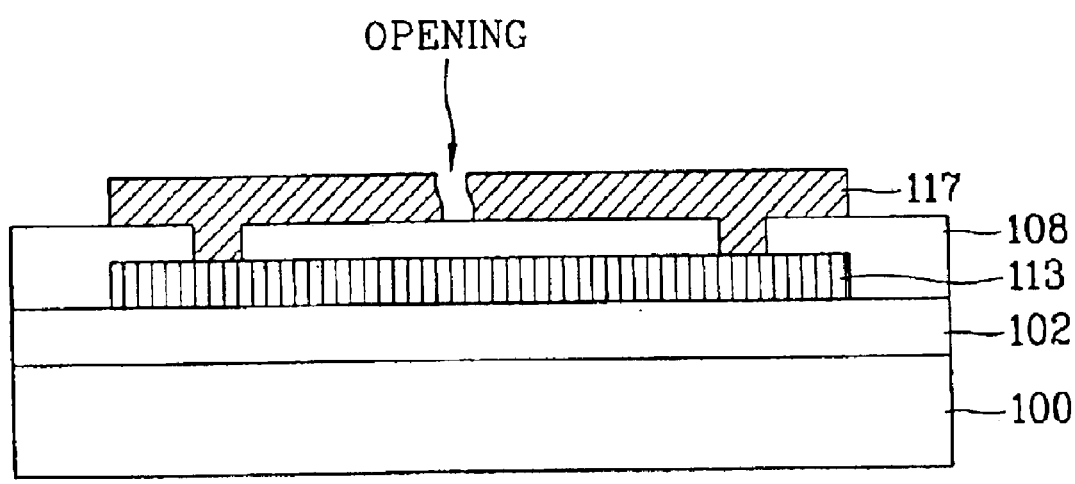
FIG. 3 is a partial cross sectional view of exemplary first and second power supply lines in the exemplary active matrix organic light emitting device according to the present invention.

FIG. 3 is a partial cross sectional view of exemplary first and second power supply lines in the exemplary active matrix organic light emitting device according to the present invention. A first supplying line 113 may be formed on the gate insulating layer 102, and the intermediate layer 108 may be formed on the first supplying line 113 and the gate insulating layer 102. Then, a plurality of contact holes may be formed within a set area on the intermediate layer 108 before formation of the second power supplying line 117. Next, the first power supplying line 113 and the second power supplying line 117 may be electrically interconnected via the contact holes. The relative positions of the contact holes, i.e., electrical contact points of the first and second power supplying lines 113 and 117, may be formed at positions dependent upon the electric conductivity of the first power supplying line 113. Accordingly, when the opening is formed within the second power supplying line 117, the exciting signal is transmitted to the first power supplying line 113 through the electrical contact points on both sides of the area where the opening is generated. Thus, the exciting signal may be successfully transmitted to each of the pixels.

However, the opening in the power supplying line 117 may not be generated during the fabrication of the organic light emitting device. The opening may be generated after the fabrication process as a result of mechanical vibration or shock. Accordingly, the first and second power supplying lines 113 and 117 may be electrically interconnected only when the opening is formed within the second power supplying line 117.

Figure 4:
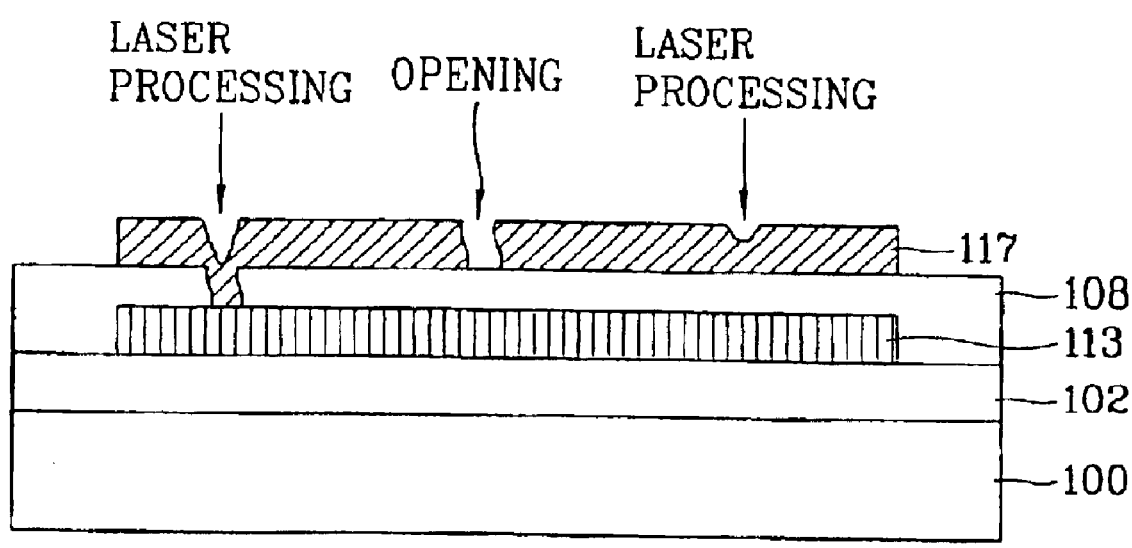
FIG. 4 is a partial cross sectional view of an exemplary method for connecting the first power supplying line and the second power supplying line using a laser in the active matrix organic light emitting device according to the present invention.

FIG. 4 is a partial cross sectional view of an exemplary method for connecting the first power supplying line and the second power supplying line using a laser in the active matrix organic light emitting device according to the present invention. The method may be performed after fabrication of the device. Specifically, if pixels within a region do not operate, an opening in the second power supplying line 117 may be identified, and the second power supplying line 117 along front and rear regions of the opening may be processed using a laser, for example. The laser may have a wavelength band by which the materials of the second power supplying line 117 and the materials of the intermediate layer 108 can be processed. For example, a YAG laser may be used in the present invention.

During processing of the second power supplying line 117 and the intermediate layer 108, the YAG laser may be irradiated and a portion of the second power supplying line 117 is melted. In addition, a portion of the intermediate layer 108 may be removed. By the removing the portion of the intermediate layer 108, the melted metal of the second power supplying line 117 may flow into the removed portion of the intermediate layer 108. Accordingly, the first power supplying line 13 and the second power supplying line 117 may be electrically interconnected by the flow of the melted metal. In FIG. 4, a left portion of the processing area representing that the second power supplying line 117 and the intermediate layer 108 may be completely processed by the irradiation of the YAG laser to electrically interconnect the first and the second power supplying lines 113 and 117, and right portion of the processing area representing the second power supplying line 117 may be melted by continuous irradiation of the YAG laser.

Accordingly, the method for electrically interconnecting the first and second power supplying lines 113 and 117 may be performed as a result of testing the fabricated organic light emitting device. Alternatively, the method for electrically interconnecting the first and second power supplying lines 113 and 117 may be performed during individual fabrication processes of the organic light emitting device. However, the method for interconnecting the first and second power supplying lines 113 and 117 may be performed only when an opening is detected in the second power supplying line 117. Thus, unnecessary fabrication processing steps may be omitted, and necessary processing may be performed on the opened part, thereby simplifying the overall fabrication process.

Although it is not shown in FIGS. 3 and 4, the laser processing may be used where shorts are generated in the second power supplying line 117 and the data line of the organic light emitting device. For example, when the second power supplying line 117 and the data line are short-circuited, both sides of the short-circuited point on the second power supplying line 117 may be processed to create an electrical open circuit. Then, front and rear portions of the second power supplying line 117 of the two opened areas and the intermediate layer 108 may be processed to connect the first and second power supplying lines 113 and 117. Thus, the short-circuited portions of the data line and the second power line 117 may be electrically insulated from the entire power supplying line.

Alternatively, the first and second power supplying lines 113 and 117 may be formed of multiple layers. For example, the redundant power supplying lines may be formed of three individual layers. In addition, the double power supplying lines according to the present invention may be applied to a voltage driving method or a current driving method of an organic light emitting device.

The voltage driving method includes a switching TFT and a driving TFT disposed in a pixel region, and a voltage is applied to the light emitting unit. The current driving method includes two switching TFTs and two driving TFTs disposed in the pixel region, and current is applied to the light emitting unit. The two driving TFTs may be operated as current mirrors to each other, thereby allowing for constant control of the current supplied to the power lines.

It will be apparent to those skilled in the art that various modifications and variations can be made in the active matrix organic light emitting device and method for fabricating the same without departing from the spirit or scope of the invention. Thus, it is intended that the present invention cover the modifications and variations of this invention provided they come within the scope of the appended claims and their equivalents.

What is claimed is:

1. An active matrix organic light emitting device, comprising:
   a plurality of gate lines and data lines respectively arranged along transverse and longitudinal directions for defining a plurality of pixel regions;
   a plurality of power lines arranged substantially parallel to the data lines;
   at least one switching thin film transistor disposed within one of the pixel regions;
   at least one driving thin film transistor disposed within the one of the pixel regions;
   an organic light emitting unit formed within the one of the pixel regions to emit light by application of a signal through one of the power lines as the driving thin film transistor is enabled; and
   a plurality of power supplying lines having at least two layers electrically interconnected to each other, the power supplying lines electrically connected with the plurality of the power lines to supply the signal to each of the power lines.

2. The device according to claim 1, wherein the switching thin film transistor and the driving thin film transistor within the pixel region are interconnected to operate as a current mirror.

3. The device according to claim 1, wherein the power supplying lines include a first power supplying line for providing the signal to the power line, and at least one second power supplying line connected to the first power supplying line to transmit the signal when the first power supplying line is electrically opened.

4. The device according to claim 3, wherein a width of the second power supplying line is equal to a width of the first power supplying line.

5. The device according to claim 3, wherein the first power supplying line and the second power supplying line are aligned along a vertical direction perpendicular to the transverse and longitudinal directions.

6. The device according to claim 3, wherein a length of the second power supplying line is equal to a length of the first power supplying line.

7. The device according to claim 3, wherein the first power supplying line and the second power supplying line extend from a first pixel region to a last pixel region along one of the transverse and longitudinal directions.

8. An active matrix organic light emitting device, comprising:
   an array including a plurality of pixel regions defined by a plurality of gate lines and data lines, the array including a plurality of power lines arranged along a direction parallel to the data lines, a driving member disposed within one of the pixel regions, and an organic emitting unit disposed in the one of the pixel regions for emitting light by application of a signal transmitted by one of the power lines according to actuation of the driving member;
   a power supplying line disposed along a side of the array for applying the signal to the plurality of power lines; and
   a redundancy power supplying line disposed along the side of the array,
   wherein the redundancy power supplying line is electrically interconnected to the power supplying line.

9. An active matrix organic light emitting device, comprising:
   a substrate having a pixel region and a power driving region;
   a semiconductor layer on the pixel region;
   a gate insulating layer disposed along an entire surface of the substrate;
   a gate electrode formed within the pixel region on the gate insulating layer;
   a first power supplying line formed within the power driving region on the gate insulating layer;
   an intermediate layer disposed over the gate insulating layer;
   source/drain electrodes disposed within the pixel region on the intermediate layer;

a second power supplying line formed within the power driving region on the intermediate layer and connected to the first power supplying line;

a passivation layer disposed over the pixel region; and an organic light emitting unit within the pixel region on the passivation layer for emitting light by application of a signal through the second power supplying line.

10. The device according to claim 9, wherein the first power supplying line is a redundancy power supplying line to electrically interconnect an open circuit portion of the second power supplying line.

11. The device according to claim 9, wherein the first power supplying line includes a material similar to a material of the gate electrode.

12. The device according to claim 9, wherein the second power supplying line includes a material similar to a material of the source/drain electrodes.

13. The device according to claim 9, wherein the organic light emitting unit includes an anode disposed on the passivation layer and connected to one of the source/drain electrodes, a light emitting layer disposed over the anode, and a cathode disposed over the light emitting layer.

14. The device according to claim 13, wherein the light emitting layer includes an organic material.

15. The device according to claim 13, wherein the cathode includes indium tin oxide (ITO).

16. The device according to claim 9, wherein the passivation layer includes an inorganic material.

17. The device according to claim 9, wherein the passivation layer includes an organic material.

18. The device according to claim 17, wherein the organic material includes benzocyclobutene.

19. The device according to claim 9, wherein the passivation layer includes an inorganic passivation sub-layer, and an organic passivation sub-layer.

20. The device according to claim 19, wherein the organic passivation sub-layer includes benzocyclobutene.

21. A method for fabricating an active matrix organic light emitting device, comprising the steps of:

forming a semiconductor layer within a pixel region of a substrate;

forming a gate insulating layer over an entire surface of the substrate;

forming respectively a gate electrode within the pixel region of the substrate on the gate insulating layer;

forming a first power supplying line within a power supplying line region on the gate insulating layer;

forming an intermediate layer over the gate insulating layer;

forming respectively a source/drain electrode connected to the semiconductor layer within the pixel region;

forming a second power supplying line connected to the first power supplying line within the power supplying line region on the intermediate layer;

forming a passivation layer over the pixel region; and forming an organic light emitting unit on the passivation layer.

22. The method according to claim 21, wherein the step of forming a first power supplying line and the step of forming a gate electrode are performed simultaneously.

23. The method according to claim 22, wherein the first power supplying line includes material similar to a material of the gate electrode.

24. The method according to claim 21, wherein the step of forming source/drain electrodes and the step of forming a second power supplying line are performed simultaneously.

25. The method according to claim 24, wherein the steps of simultaneously forming source/drain electrodes and a second power supplying line includes sub-steps of:

forming a first contact hole in the gate insulating layer and the intermediate layer of the pixel region;

forming the source/drain electrodes electrically connected to the semiconductor layer through the first contact hole within the pixel region on the intermediate layer;

forming at least two second contact holes in the intermediate layer of the power supplying line region; and forming the second power supplying line electrically interconnected to the first power supplying line through the second contact holes within the power supplying line region on the intermediate layer.

26. The method according to claim 21, wherein the step of forming source/drain electrodes and forming a second power supplying line includes sub-steps of forming contact holes in the gate insulating layer and the intermediate layer of the pixel region and in the intermediate layer of the power supplying line region, and forming metal layers within the pixel region and the power supplying line region on the intermediate layer to form the source/drain electrodes and the second power supplying line.

27. The method according to claim 21, wherein the step of forming the organic light emitting unit includes the sub-steps of:

forming an anode to be electrically connected to one of the source/drain electrodes on the passivation layer;

forming a light emitting layer over the anode; and forming a cathode over the light emitting layer.

28. The method according to claim 27, wherein the light emitting layer includes organic material.

29. A method for fabricating an active matrix organic light emitting device, comprising the steps of:

forming a semiconductor layer within a pixel region of a substrate;

forming a gate insulating layer over an entire surface of the substrate;

forming a gate electrode within the pixel region on the gate insulating layer;

forming a redundant power supplying line within a power supplying line region on the gate insulating layer;

forming an intermediate layer over the gate insulating layer;

forming respectively a source/drain electrode electrically connected to the semiconductor layer within the pixel region through the gate insulating layer and intermediate layer;

forming a power supplying line within the power supplying region on the intermediate layer;

forming a passivation layer over the pixel region;

forming an organic light emitting unit on the passivation layer; and electrically interconnecting the power supplying line with the redundant power supplying line by processing side portions of an open circuit portion of the power supplying line with light from a light source when the power supplying line is electrically opened.

30. The method according to claim 29, further comprising the step of testing the electrically opened portion of the power supplying line.

31. The method according to claim 29, wherein the step of connecting the power supplying line with the redundant power supplying line includes the sub-steps of:

irradiating the light to a connecting area of the power supplying line to melt the power supplying line at the connecting area; and removing a portion of the intermediate layer under the connecting area and filling the melted power supplying line in the removed portion of the intermediate layer by the light irradiation to electrically interconnect the power supplying line with the redundant power supplying line at the connecting area.

32. The method according to claim 31, wherein the light source includes a laser.

33. The method according to claim 32, wherein the laser includes a YAG laser.

* * * * *